(12) United States Patent
Wu et al.

(10) Patent No.: US 7,995,354 B2
(45) Date of Patent: Aug. 9, 2011

(54) CASING STRUCTURE HAVING REMOVABLE BASE FRAME

(75) Inventors: Kai-Kuei Wu, Sanchong (TW); Hsiao-Liang Chen, Banciao (TW)

(73) Assignee: Micro-Star Internationa'l Co., Ltd., Jung-He (TW)

( * ) Notice: Subject to any disclaimer, the term of this patent is extended or adjusted under 35 U.S.C. 154(b) by 458 days.

(21) Appl. No.: 12/330,625

(22) Filed: Dec. 9, 2008

(65) Prior Publication Data
US 2010/0027230 A1 Feb. 4, 2010

(30) Foreign Application Priority Data
Jul. 30, 2008 (TW) .............................. 97213514 U

(51) Int. Cl.
*H05K 7/14* (2006.01)
(52) U.S. Cl. ........................................ 361/801; 361/726
(58) Field of Classification Search .................. 361/801, 361/726, 732, 747, 759
See application file for complete search history.

(56) References Cited

U.S. PATENT DOCUMENTS

| | | | | |
|---|---|---|---|---|
| 5,661,640 A * | 8/1997 | Mills et al. | ..................... | 361/801 |
| 6,229,710 B1 * | 5/2001 | Chen | ............................. | 361/801 |
| 6,937,476 B1 * | 8/2005 | Chen et al. | ..................... | 361/756 |
| 6,956,745 B2 * | 10/2005 | Kerrigan et al. | .............. | 361/726 |
| 7,106,601 B2 * | 9/2006 | Chen et al. | ..................... | 361/801 |
| 7,110,264 B2 * | 9/2006 | Chen et al. | ..................... | 361/801 |
| 7,254,037 B2 * | 8/2007 | Chen et al. | ..................... | 361/726 |
| 7,262,960 B2 * | 8/2007 | Huang | .......................... | 361/726 |
| 7,330,358 B2 * | 2/2008 | Chen et al. | ..................... | 361/810 |
| 7,342,808 B2 * | 3/2008 | Chen et al. | ..................... | 361/801 |
| 7,342,809 B2 * | 3/2008 | Chen et al. | ..................... | 361/801 |
| 7,433,183 B2 * | 10/2008 | Huang | .......................... | 361/726 |
| 2005/0146846 A1 * | 7/2005 | Chen et al. | ..................... | 361/726 |
| 2010/0188824 A1 * | 7/2010 | Benedetto et al. | ............ | 361/747 |

* cited by examiner

*Primary Examiner* — Lisa Lea-Edmonds
(74) *Attorney, Agent, or Firm* — Workman Nydegger

(57) ABSTRACT

A casing structure having a removable base frame includes a casing and a base frame. The casing includes a bottom plate, wall plates, and a bracket disposed on the bottom plate. A top stopper is erected on the bracket. The base frame has a frame plate for disposing the base frame astride the wall plates. The base frame is also disposed with a mounting plate corresponding to the top stopper. The mounting plate has a rotatable push-actuated member. When the push-actuated member rotates and is pressed against the top stopper, the base frame is pushed up and removed from the casing.

7 Claims, 7 Drawing Sheets

CASING STRUCTURE HAVING REMOVABLE BASE FRAME

CROSS-REFERENCE TO RELATED APPLICATIONS

This non-provisional application claims priority under 35 U.S.C. §119(a) on Patent Application No(s). 097213514 filed in Taiwan, R.O.C. on Jul. 30, 2008 the entire contents of which are hereby incorporated by reference.

BACKGROUND OF THE INVENTION

1. Field of Invention

The present invention relates to a casing structure having a removable base frame, and more particularly to a casing structure having a removable base frame applicable to an expansion card.

2. Related Art

In recent years, the number of Internet users is growing at a multiplying rate every year. Companies and other organizations set up their own websites and servers one after another, hoping that the customers can know the products and features of the companies without appearing in person, thereby bring infinite business opportunities for the companies.

Currently, a common server includes a mainboard, and one or more expansion cards are inserted on the mainboard according to users' specific requirements to perform specific functions. For example, a network card is installed on the mainboard of a server, such that the server functions as a web page server. After the web page server receives an instruction request from a client, the website server replies to the instruction sent by the client program.

As the cost of the servers increase and the available space reduces, most servers are mostly arranged uniformly in a cabinet in use, which are referred to as rack-mounted servers, so as to minimize the space occupied by the servers. In addition, since the servers are designed according to international standards, the planar dimensions are uniform, so the servers can be connected with or manage other equipment conveniently.

According to height, the servers are categorized into a variety of specifications such as 1 U (1 U=1.75 inch=44.45 mm) servers, 2 U servers, and 3 U servers. However, limited by the space of the rack and the current state of technology, 1 U servers are still the mainstream of the market. Therefore, the expansion card certainly cannot be easily inserted into or pulled out from the mainboard of the server as in an ordinary personal computer.

A conventional method for installing an expansion card on a mainboard of a server is to use both hands to simultaneously apply a force on two side of an expansion card module, so as to insert the expansion card into a connection port of the mainboard, and then secure the expansion card module on an electronic apparatus with screws. When it is desired to pull out the expansion card, the screws need to be screwed off first, and then a force is exerted on the expansion card module to pull out the expansion card module. Another conventional installation method is to fix the expansion card below a fixing module first. Then fixing module is in a suitcase-like form and is provided with a handle at an upper side. When the expansion card needs to be inserted into or pulled out from the connection port, a force is then exerted on the handle to insert or pull out the expansion card.

However, the prior art has the following problems. When it is desired to pull out the expansion card module, one end of the expansion card module may be under a relatively large force and the other end may be under a relatively small force due to an uneven force exerted by the user, such that the end under the relatively large force is first pulled out from the connection port. Thus, the expansion card is released from the connection port at an inclination angle rather than in a completely horizontal direction, or the user exerts a lateral force rather than a force perpendicular to the mainboard, either of which results in abnormal contact of the golden fingers of the expansion card with the connection port, thereby resulting in the damage of the golden fingers and abnormal operation of the expansion card after being installed on the mainboard. Furthermore, when the expansion card module is installed, additional screws are needed to secure the expansion card module to the electronic apparatus, thereby resulting in inconvenience in disassembly, assembly, and maintenance.

SUMMARY OF THE INVENTION

For the conventional expansion card module, when the expansion card is inserted into or pulled out from the connection port, the golden fingers of the expansion card are easy to be damaged due to improper operations, resulting in abnormal operation of the expansion card. Furthermore, screws are needed to secure the expansion card module to the electronic apparatus, resulting in a low speed of disassembly, assembly, and maintenance.

Accordingly, the present invention is directed to a casing structure having a removable base frame. The casing structure includes a casing and a base frame. The casing includes a bottom plate, a plurality of wall plates, and a bracket. The wall plates are erected at a periphery of the bottom plate to form an accommodating space. The bracket is disposed on the bottom plate, and top stoppers are erected on the bracket. The base frame is provided with a frame plate disposed astride the wall plates. The base frame is provided with a mounting plate at a position corresponding to the top stoppers. Push-actuated members are pivoted on the mounting plate. The push-actuated members can rotate relative to the mounting plate, and is provided with an urging portion at one end. When the push-actuated members are at a retracted position, a pitch exists between the urging portion and the top stoppers. When the push-actuated members are at a removing position, the urging portion is pressed against the top stoppers to push up the base frame by a distance.

The efficacy of the casing structure having a removable base frame of the present invention lies in that, the bracket is disposed on the bottom plate, the top stoppers are erected on the bracket, and the mounting plate is disposed relatively above the top stoppers. When the push-actuated members rotate, the urging portion is pressed against the top stoppers, such that the mounting plate is displaced relative to the bracket, thereby releasing the base frame from the casing. Therefore, screw fixation can be omitted, thereby allowing an easy and fast disassembly and improving the convenience in assembly and maintenance.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
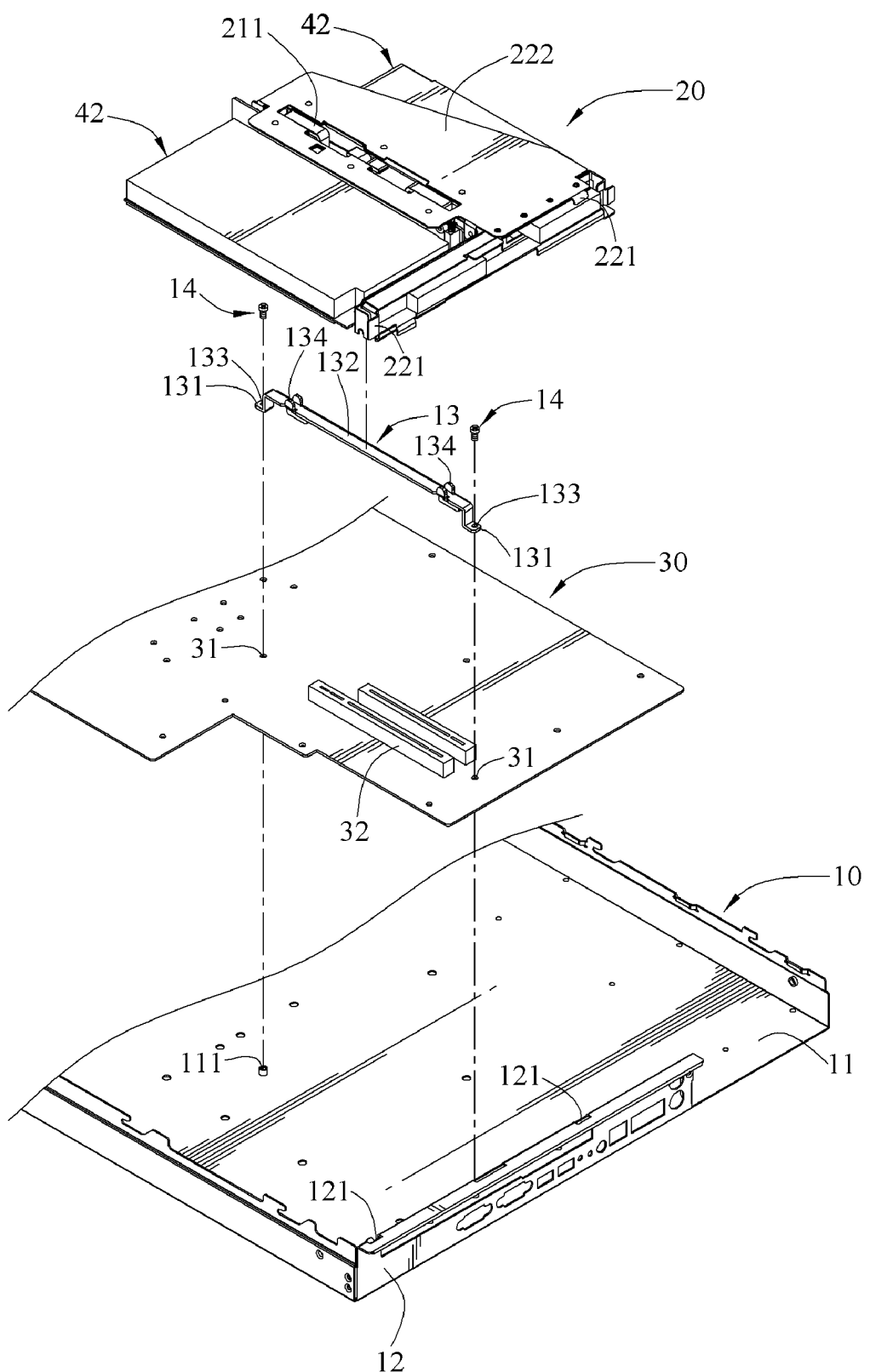
FIG. 1 is an exploded view according to a first embodiment of the present invention.
Figure 2:
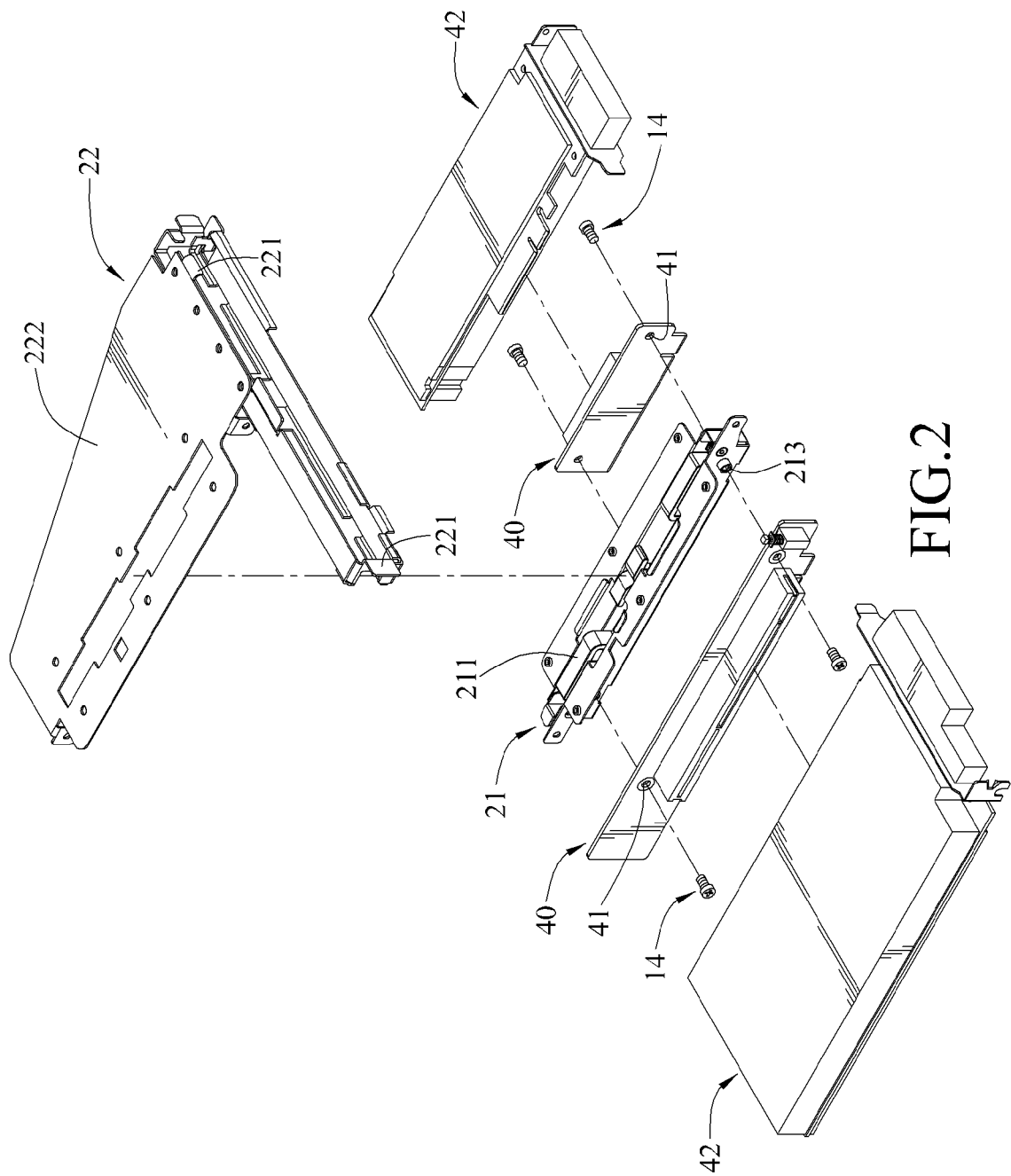
FIG. 2 is an exploded view of a base frame according to the first embodiment of the present invention.
Figure 3:
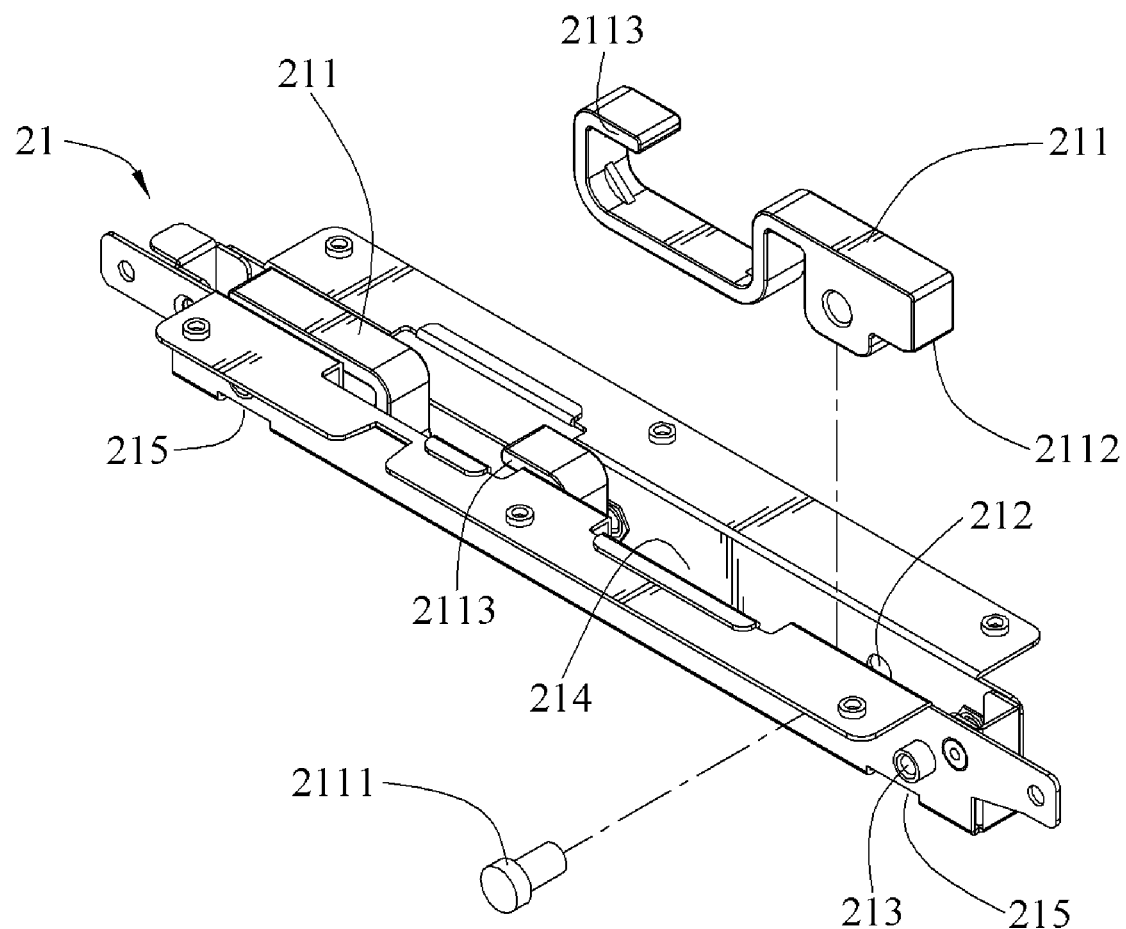
FIG. 3 is an exploded view of a mounting plate according to the first embodiment of the present invention.
Figure 4:
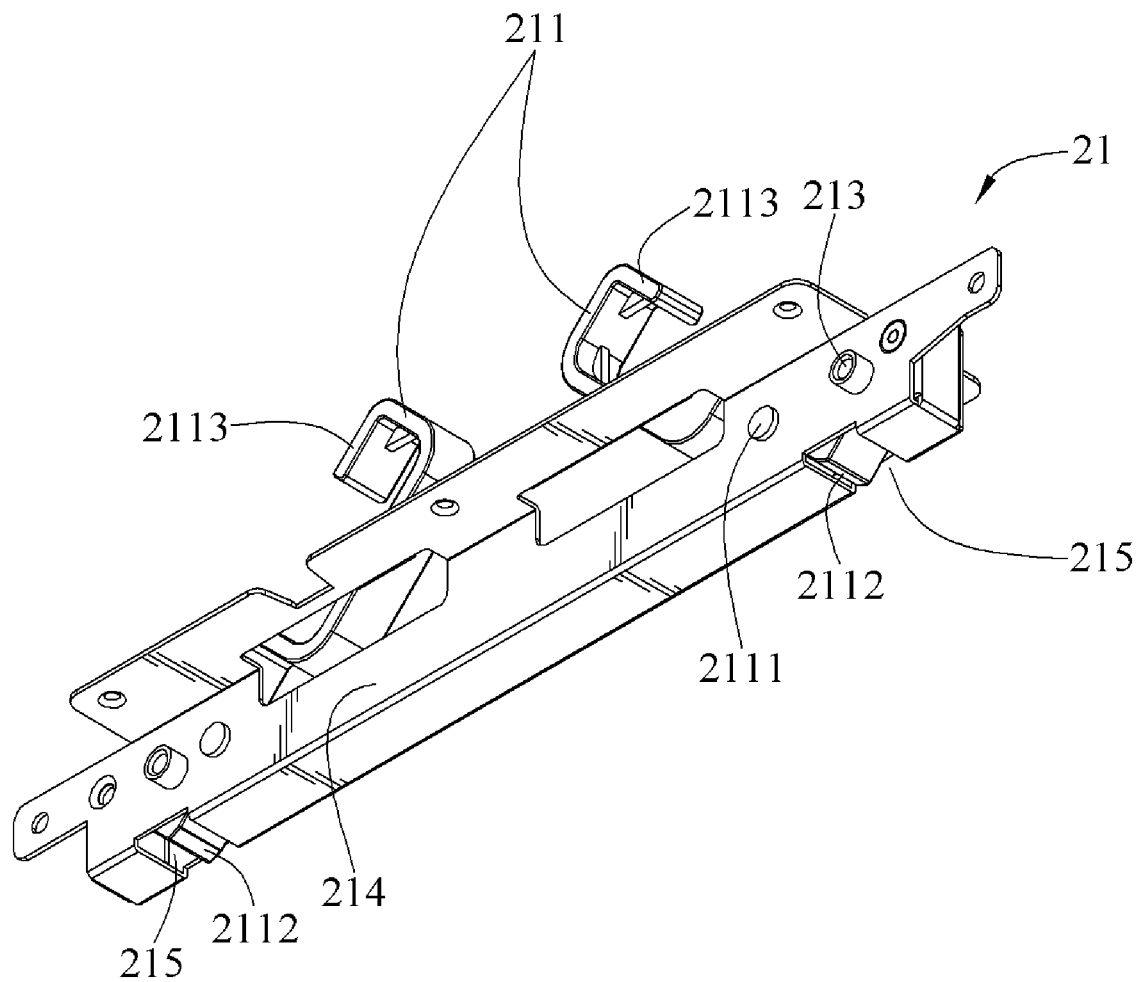
FIG. 4 is a schematic view of the mounting plate according to the first embodiment of the present invention.
Figure 5:
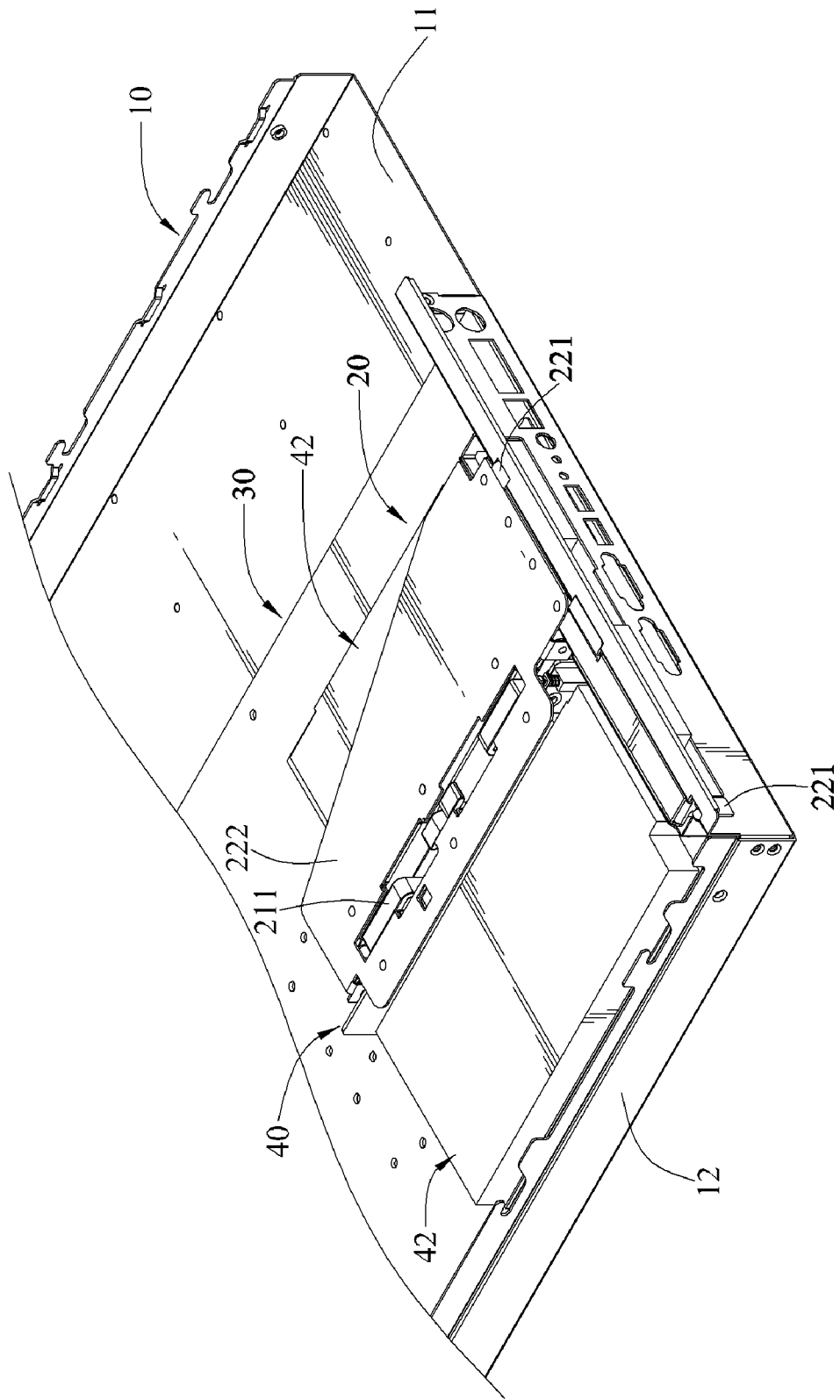
FIG. 5 is a schematic assembly view according to the first embodiment of the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. The following embodiments are intended to describe the present invention in further detail, and are not intended to limit the scope of the present invention in any way.

The casing structure having a removable base frame provided in the present invention is applicable to electronic apparatuses such as personal computers, notebooks, industrial computers, and servers that need additional expansion cards such as sound cards and network cards on mainboards thereof to realize specific functions. In the detailed description of the present invention below, the server is used as the preferred embodiment of the present invention. However, the accompanying drawings are for the purpose of reference and illustration only, and are not intended to limit the present invention.

FIGS. 1 to 5 are schematic assembly views according to the first embodiment of the present invention. Referring to FIGS. 1 to 5, a casing structure having a removable base frame of the present invention includes a casing 10 and a base frame 20.

The casing 10 includes a bottom plate 11, a plurality of wall plates 12, and a bracket 13. The wall plates 12 are disposed at a periphery of the bottom plate 11 and perpendicular to the bottom plate 11, so as to form an accommodating space. The bracket 13 is fixed on the bottom plate 11. The base frame 20 is provided with a mounting plate 21. When the base frame 20 is disposed in the accommodating space, the mounting plate 21 is relatively above the bracket 13.

A mainboard 30 is installed on the bottom plate 11. The bracket 13 includes two side sheets 131 and a rod 132. The side sheets 131 are respectively located at two sides of the rod 132, and relatively lower than the rod 132. The side sheets 131 are provided with through holes 133. The mainboard 30 is provided with the same number of through holes 31 with the through holes 133. The bottom plate 11 is provided with fixing holes 111 relative to the through holes 133 and the through holes 31, such that screws 14 are passed through the through holes 133 and the through holes 31 to fix the bracket 13 to the bottom plate 11 and above the mainboard 30. Recesses on two ends of the rod 132 are respectively provided with top stoppers 134 erected on the rod 132. The top stoppers 134 are arc-shaped.

The base frame 20 is further provided with a frame plate 22. The frame plate 22 is disposed astride the wall plates 12. The frame plate 22 is provided with a plurality of inserting plates 221 inserted into jacks 121 of the wall plates 12 to fix the base frame 20 on the wall plates 12 without using additional fixing members such as screws to fix the frame plate 22.

The mounting plate 21 is connected to a sheet 222 of the frame plate 22 and can thus be installed on the wall plates 12 together with the frame plate 22. The mounting plate 21 is located relatively above the top stoppers 134. The mounting plate 21 is provided with push-actuated members 211 at both sides. The mounting plate 21 is further provided with through holes 212. The push-actuated members 211 are provided with pivots 2111 at positions corresponding to the through holes 212. The pivots 2111 are pivotally disposed in the through holes 212, such that the push-actuated members 211 can rotate relative to the mounting plate 21.

The mounting plate 21 is provided with a plurality of fixing holes 213 on both sides. The fixing holes 213 are used to install an expansion card 40 on the mounting plate 21. The expansion card 40 is provided with the same number of through holes 41 as the fixing holes 213, such that the fixing members such as the screws 14 are passed through the through holes 41 to fix the expansion card 40 to the fixing holes 213, thereby fixing the expansion card 40 to the mounting plate 21. After the expansion card 40 is installed on the mounting plate 21, an expansion card module 42 may then be installed on the expansion card 40 if 40 if necessary. When the expansion card 40 is inserted into a connection port 32 of the mainboard 30, the inserting plates 221 are inserted into the jacks 121 at the same time, such that the base frame 20 is disposed astride the wall plates 12.

The mounting plate 21 is provided with an accommodating groove 214 at the side not facing the bottom plate 11. When at a retracted position, the push-actuated members 211 can be placed flat in the accommodating groove 214 without protruding from a surface of the mounting plate 21, thereby minimizing the height of the casing structure of the present invention.

Figure 6:
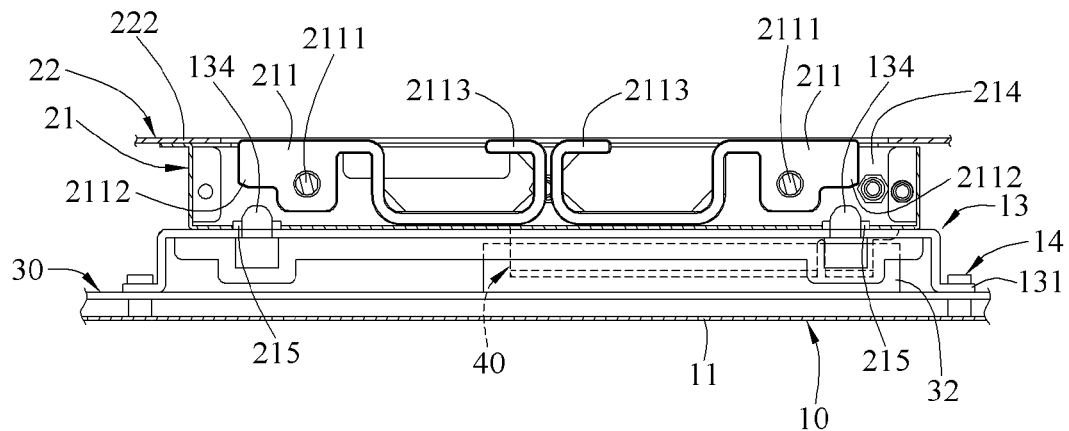
FIG. 6 is a schematic disassembly view according to the first embodiment of the present invention.
Figure 7:
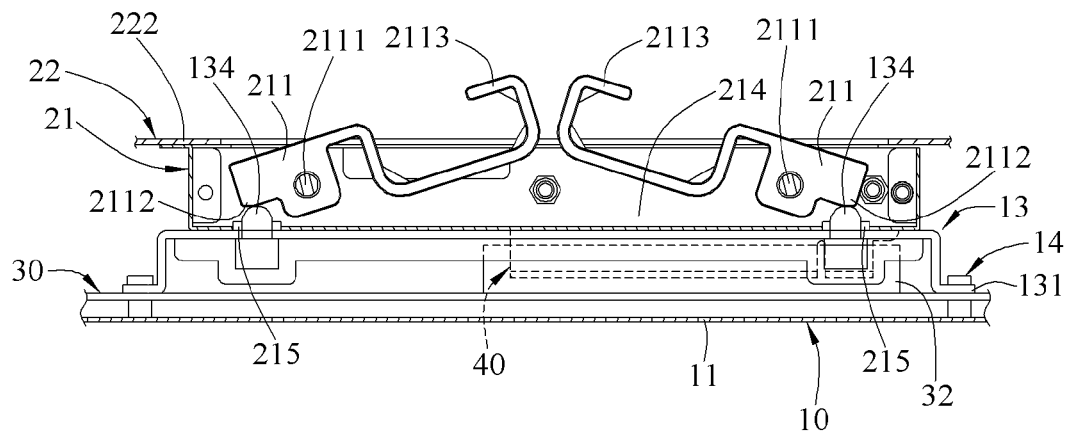
FIG. 7 is another schematic disassembly view according to the first embodiment of the present invention.
Figure 8:
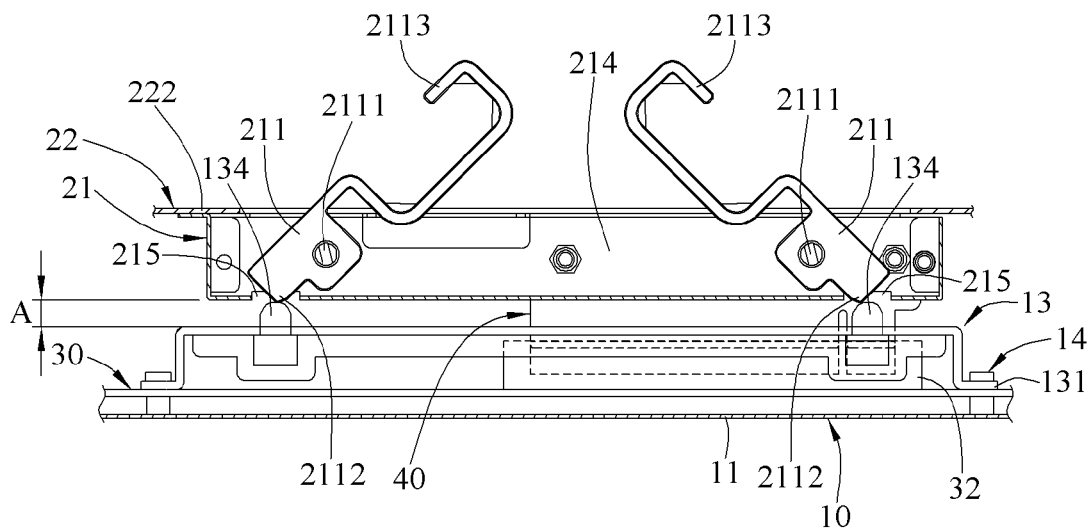
FIG. 8 is still another schematic disassembly view according to the first embodiment of the present invention.

FIGS. 6 to 8 are schematic views of operations according to the first embodiment of the present invention. Referring to FIGS. 6 to 8, the push-actuated members 211 are provided with urging portions 2112 for pressing the top stoppers 134, and are provided with push-actuated portions 2113 at the other ends relative to the urging portions 2112. The mounting plate 21 is further provided with openings 215. A width of the bracket 13 equals to those of the openings 215. Therefore, when the base frame 20 is disposed astride the wall plates 12, not only the mounting plate 21 is located above the bracket 13, but also the top stoppers 134 can extend into the mounting plate 21 via the openings 215, such that the urging portions 2112 can contact the top stoppers 134 when the push-actuated members 211 are rotated.

Contact angles between the urging portions 2112 and the top stoppers 134 are not right angles, such that when the urging portions 2112 are pressed against the top stoppers 134, the pressing force is upward and perpendicular to the bracket 13 and the lateral force parallel to both ends of the side sheets 131 are reduced, thereby preventing the generation of a lateral force perpendicular to both ends of the side sheets 131. When the push-actuated members 211 are at the retracted position, pitches exist between the top stoppers 134 and the urging portions 2112, which prevents displacement interference between the urging portions 2112 and the top stoppers 134 due to the manufacturing error when the expansion card 40 is inserted into the connection port 32, thereby avoiding the situation that the expansion card expansion card 40 cannot be completely inserted into the connection port 32. The push-actuated portions 2113 are [-shaped structures, which enable a user to exert a pulling force on the push-actuated portions 2113 to drive the push-actuated members 211 to rotate, thereby enabling the urging portions 2112 to press against the top stoppers 134. The mounting plate 21 on two sides of the push-actuated portions 2113 is provided with slots wider than two sides of the urging portions 2112, which allows fingers of the user to easily reach into the [-shaped structures without being caught by the mounting plate 21.

After the urging portions 2112 are brought into contact with the top stoppers 134 by rotating the push-actuated members 211 by an angle, when the user continues to exert a pulling force to rotate the push-actuated members 211 by a larger angle, no displacement occurs to the bracket 13 since it is fixed on the bottom plate 11. Therefore, a counter force against the urging portions 2112 is generated. Since the push-actuated members 211 are installed on the mounting plate 21, the base frame 20 can be pushed up to a height A by the urging portions 2112 pressing against the top stoppers 134, such that the base frame 20 is at a removing position. The height A is greater than a length of golden fingers of the expansion card 40 clamped by the connection port 32, such that the expansion card 40 is released from the connection port 32. The user exerts a pulling force on the two push-actuated portions 2113 at the same time, so as to enable the expansion card 40 to be released from the connection port 32 in a horizontal manner. Moreover, when the urging portions 2112 are pressed against the top stoppers 134, an upward force perpendicular to the bracket 13 is generated. In this manner, the lateral force can be reduced, and the golden fingers can thus be prevented from damage.

Figure 9:
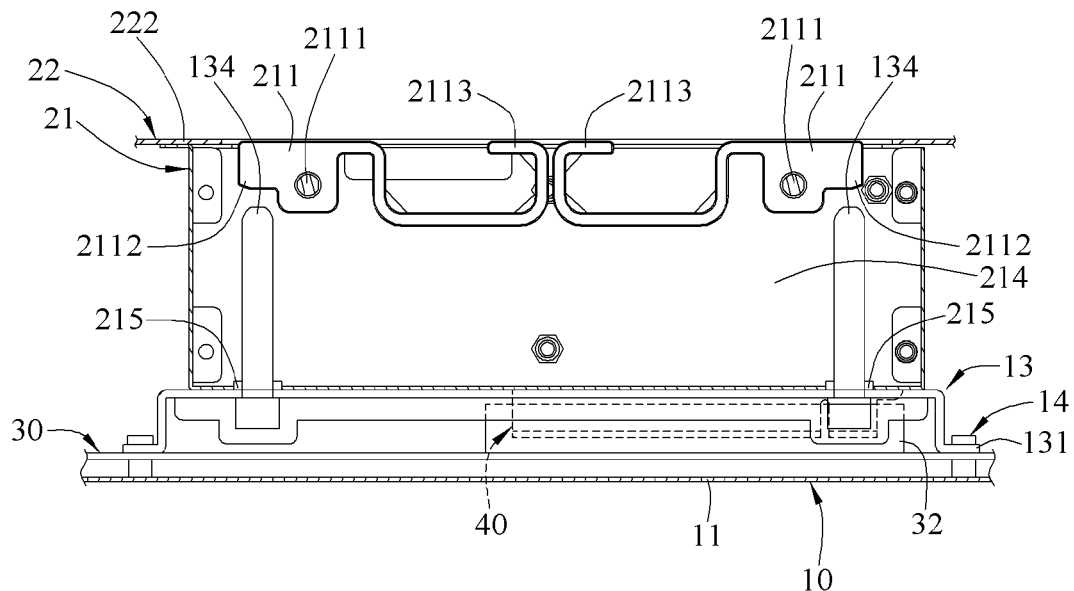
FIG. 9 is a schematic view according to a second embodiment of the present invention.

FIG. 9 is a schematic view according to a second embodiment of the present invention. Referring to FIG. 9, this embodiment differs from the first embodiment in that, wall plates 12 (not shown in the figure) of the electronic apparatus in this embodiment are higher, and thus the expansion card 40 installed is also relatively higher. Therefore, by properly changing the heights of the accommodating groove 214 and the top stoppers 134, such that the top stoppers 134 extend into the accommodating groove 214 via the openings 215, and the urging portions 2112 of the push-actuated members 211 are pressed against the top stoppers 134, the casing structure having a removable base frame of the present invention can be applied to electronic apparatuses having various heights. The detailed operation is similar to that of the first embodiment, and the details will not be described herein again.

The efficacy of the casing structure having a removable base frame provided in the present invention lies in that, the expansion card is fixed to the casing upon being inserted into the connection port, since the base frame is disposed astride the wall plates. When it is desired to remove the expansion card, the base frame can be horizontally pushed up by a distance by using the push-actuated members to press against the urging portions, thereby releasing the expansion card from the connection port. Therefore, damage of the golden fingers caused by improper operations can be avoided, and screw fixation is omitted, thereby allowing an easy and fast disassembly and improving the convenience in assembly and maintenance.

What is claimed is:

1. A casing structure having a removable base frame, comprising:
    a casing, comprising a bottom plate and a plurality of wall plates disposed at a periphery of the bottom plate, wherein the plurality of wall plates forms an accommodating space, a bracket is disposed on the bottom plate, and a top stopper is erected on the bracket; and
    a base frame, disposed in the accommodating space and provided with a mounting plate corresponding to the top stopper, wherein a rotatable push-actuated member is pivoted on the mounting plate, the push-actuated member comprises an urging portion at one end, and the push-actuated member has a retracted position where a pitch is kept between the urging portion and the top stopper and a removing position where the urging portion is pressed against the top stopper to push up the base frame by a distance.

2. The casing structure having the removable base frame according to claim 1, wherein the base frame further comprises a frame plate for disposing the base frame astride the wall plates.

3. The casing structure having the removable base frame according to claim 1, wherein the mounting plate further comprises an opening, and the top stopper extends into the mounting plate via the opening.

4. The casing structure having the removable base frame according to claim 1, wherein the mounting plate further comprises a fixing hole.

5. The casing structure having the removable base frame according to claim 1, wherein the mounting plate further has a through hole, the push-actuated member comprises a pivot corresponding to the through hole, and the pivot is pivoted to the through hole, such that the push-actuated member rotates relative to the mounting plate.

6. The casing structure having the removable base frame according to claim 1, wherein the mounting plate further comprises an accommodating groove, and the push-actuated member is disposed in the accommodating groove.

7. The casing structure having the removable base frame according to claim 1, wherein an actuating portion is further disposed at the other end of the push-actuated member relative to the urging portion.

* * * * *